United States Patent
Nishikawa et al.

(10) Patent No.: US 8,618,551 B2
(45) Date of Patent: Dec. 31, 2013

(54) SEMICONDUCTOR LIGHT EMITTING DEVICE

(75) Inventors: Yukie Nishikawa, Fukuoka-ken (JP);
Hironori Yamasaki, Fukuoka-ken (JP);
Katsuyoshi Furuki, Fukuoka-ken (JP);
Takashi Kataoka, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 37 days.

(21) Appl. No.: 13/219,862

(22) Filed: Aug. 29, 2011

(65) Prior Publication Data
US 2012/0273793 A1 Nov. 1, 2012

(30) Foreign Application Priority Data
Apr. 26, 2011 (JP) .................. 2011-098374

(51) Int. Cl.
*H01L 31/0256* (2006.01)
(52) U.S. Cl.
USPC ........ 257/76; 257/98; 257/198; 257/E33.011; 257/E33.012; 257/E33.06; 438/29; 438/34; 438/37; 438/47; 438/69
(58) Field of Classification Search
None
See application file for complete search history.

(56) References Cited

U.S. PATENT DOCUMENTS

| | | | |
|---|---|---|---|
| 8,040,463 B2 | 10/2011 | Kazama | |
| 2008/0093612 A1* | 4/2008 | Konno et al. | 257/96 |
| 2008/0283819 A1* | 11/2008 | Konno | 257/13 |
| 2010/0065813 A1 | 3/2010 | Kondo et al. | |
| 2011/0291133 A1 | 12/2011 | Tanaka et al. | |
| 2012/0018752 A1 | 1/2012 | Fujiwara et al. | |

FOREIGN PATENT DOCUMENTS

JP  2009-065109  3/2009

* cited by examiner

*Primary Examiner* — Yasser Abdelaziez
(74) *Attorney, Agent, or Firm* — White & Case LLP (57) ABSTRACT

According to one embodiment, a semiconductor light emitting device includes a substrate, a first electrode, a first conductivity type layer, a light emitting layer, a second conductivity type layer and a second electrode. The first conductivity type layer includes a first contact layer, a window layer having a lower impurity concentration than the first contact layer and a first cladding layer. The second conductivity type layer includes a second cladding layer, a current spreading layer and a second contact layer. The second electrode includes a narrow-line region on the second contact layer and a pad region electrically connected to the narrow-line region. Band gap energies of the first contact and window layers are larger than that of the light emitting layer. The first contact layer is provided selectively between the window layer and the first electrode and without overlapping the second contact layer as viewed from above.

13 Claims, 6 Drawing Sheets

SEMICONDUCTOR LIGHT EMITTING DEVICE

CROSS-REFERENCE TO RELATED APPLICATIONS

This application is based upon and claims the benefit of priority from the prior Japanese Patent Application No. 2011-098374, filed on Apr. 26, 2011; the entire contents of which are incorporated herein by reference.

FIELD

Embodiments described herein relate generally to a semiconductor light emitting device.

BACKGROUND

High output is required for a light emitting diode (LED) used for an illumination device, a display device, a traffic signal, a sensor device and the like.

In the case of an LED with a reflective metal in which light emitted downward from a light emitting layer is reflected upward by the reflective metal layer, light extraction efficiency can be improved.

However, if a current injected from an electrode on the reflective metal layer side is, for example, too much spread laterally, an effective current injection density in the light emitting layer decreases, resulting in a reduction of the light emission efficiency. Therefore, it becomes difficult to achieve higher optical output.

DETAILED DESCRIPTION

In general, according to one embodiment, a semiconductor light emitting device includes a substrate, a first electrode, a first conductivity type layer, a light emitting layer, a second conductivity type layer and a second electrode. The first electrode is provided on the substrate. The first conductivity type layer is provided on the first electrode, and includes a first contact layer, a window layer and a first cladding layer in this order from a side of the first electrode. The window layer has an impurity concentration lower than an impurity concentration in the first contact layer. The light emitting layer is provided on the first conductivity type layer. The second conductivity type layer is provided on the light emitting layer, and includes a second cladding layer, a current spreading layer and a second contact layer in this order from a side of the light emitting layer. The second electrode is provided on the second conductivity type layer, and includes a narrow-line region and a pad region. Part of the narrow-line region extends on the second contact layer. The pad region is provided on a non-formation region of the second contact layer and is electrically connected to the narrow-line region. A band gap energy of the first contact layer and a band gap energy of the window layer are larger than a band gap energy of the light emitting layer. The first contact layer provided selectively between the window layer and the first electrode. The first contact layer and the second contact layer are provided not to overlap each other as viewed from above.

Various embodiments will be described hereinafter with reference to the accompanying drawings.

Figure 1A:
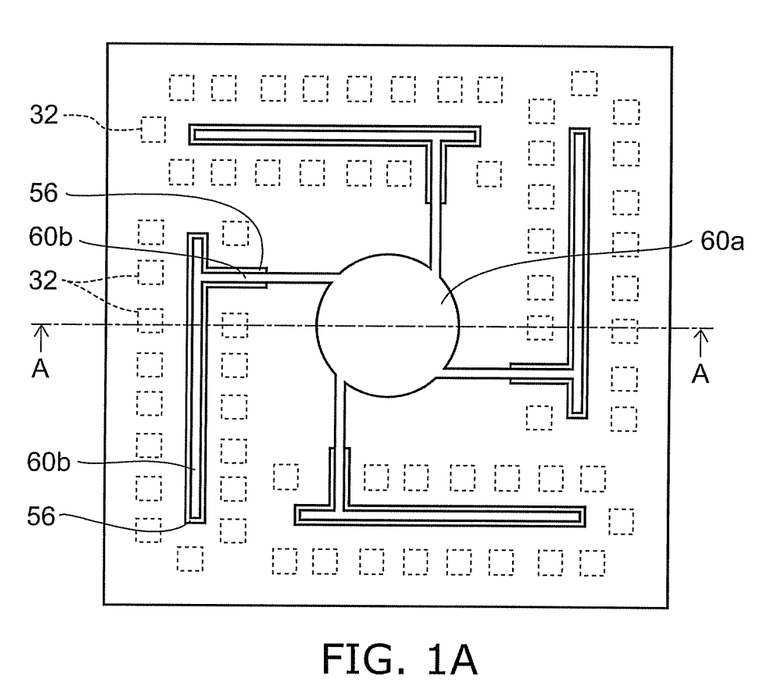
FIG. 1A is a schematic plan view of a semiconductor light emitting device according to a first embodiment.
Figure 1B:
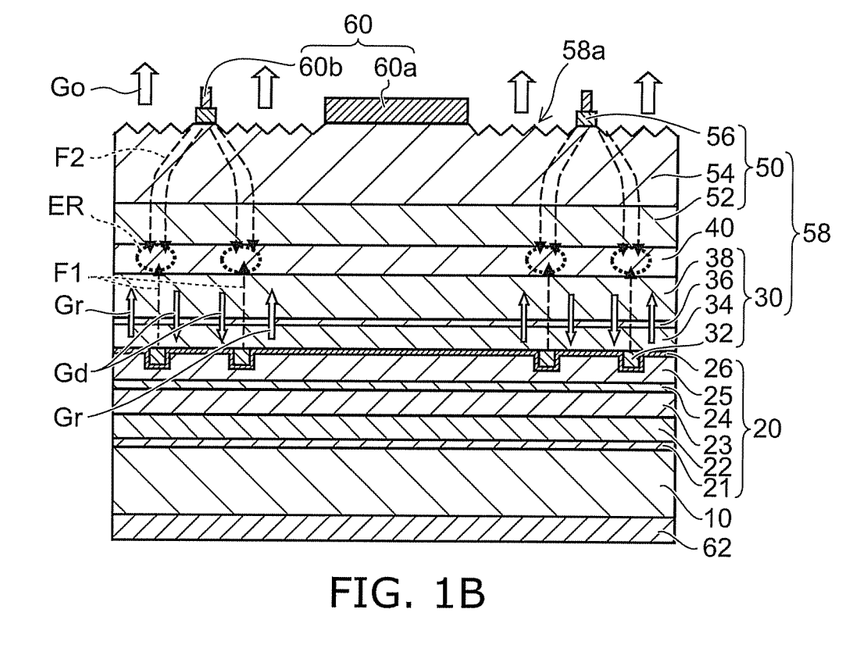
FIG. 1B is a schematic cross-sectional view taken along A-A line.

FIG. 1A is a schematic plan view of a semiconductor light emitting device according to a first embodiment, and FIG. 1B is a schematic cross-sectional view taken along A-A line.

The semiconductor light emitting device includes a substrate 10, a first electrode 20 provided on the substrate 10 and a semiconductor layer 58 provided on the first electrode 20. The semiconductor layer 58 includes a light emitting layer 40, a window layer 34 and a first contact layer 32. Part of the window layer 34 is in contact with the first electrode 20. It is noted that, in the specification, "window layer" is referred to as a layer having a bad-gap energy larger than a band-gap energy of the light emitting layer 40 and being able to transmit the light from the light emitting layer.

The first contact layer 32 is provided selectively between the window layer 34 and the first electrode 20. The contact layer 32 is in contact with the window layer 34 and the first electrode 20 and has a conductivity higher than a conductivity of the window layer 34. In this manner, a contact resistance between the first electrode 20 and the first contact layer 32 can be reduced compared with a contact resistance between the first electrode 20 and the window layer 34. Thus, carriers can be injected from the first electrode 20 into the window layer 34 through the first contact layer 32.

As shown in FIG. 1B, the semiconductor layer 58 can include the first contact layer 32, the window layer 34, a compositional graded layer 36, a first cladding layer 38, the light emitting layer 40, a second cladding layer 52, a current spreading layer 54, a second contact layer 56 in this order from a side of the first electrode. The structure of the semiconductor layer 58 is not limited thereto. A second electrode 60 can include a pad region 60a provided on a non-formation region of the second contact layer 56 and a narrow-line region 60b connected to the pad region 60a. Part of the narrow-line region 60b is provided on the second contact layer 56. In this case, the narrow-line region 60b is provided on the non-formation region of the second contact layer 56 around the pad region 60a. Since the first contact layer does not exist around the pad region 60a and current does not flow there, the second contact layer 56 is unnecessary around the pad region. The light extraction efficiency can be improved by concave-convex structures on a light extraction surface of the semiconductor layer 58 without the second contact layer 56 and the second electrode 60.

By using the conductive substrate 10, current can flow from the first electrode 20 to a back surface electrode 62 provided on the back surface of the substrate 10.

The first electrode 20 can include, for example, a transparent conductive film 26, a reflective metal layer 25, a barrier metal layer 24, a second bonding metal layer 23, a first bonding metal layer 22, a barrier metal layer 21 in this order from the side of the semiconductor layer 58. Here, the structure is not limited thereto.

As shown in the schematic plan view of FIG. 1A, the second contact layer 56 is provided so as not to overlap the first contact layer 32 shown by dotted lines as viewed from above. The first contact layer 32 can include multiple regions dispersed along the narrow-line region 60b. That is, the current flows between the first electrode 20 and the second electrode 60 through the selectively provided first contact layer 32. The shortest distance between the narrow-line region 60b and the first contact layer 32 can be, for example, 5 μm as viewed from above. Therefore, a high emission intensity region in the emitting layer is configured not to overlap the narrow-line region 60b and second contact layer 56, and thus high brightness can be achieved. In FIG. 1A, a shape of the first contact layer 32 is square, however the planar shape is not limited thereto and may be rectangular, circular, elliptical and polygonal or the like.

Figure 2:
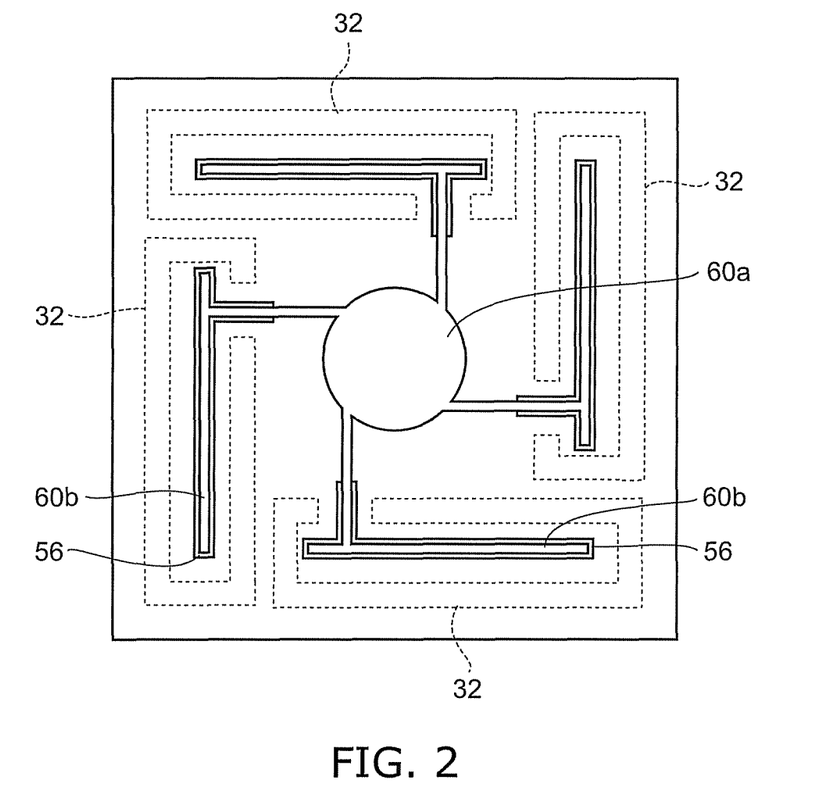
FIG. 2 is a schematic plan view of a semiconductor light emitting device according to a variation of the first embodiment.

FIG. 2 is a schematic plan view of a semiconductor light emitting device according to a variation of the first embodiment.

The first contact layer 32 may be shaped in a rectangle having a width of a few micrometers and a length of a few tens micrometers along the narrow-line region 60b as viewed from above. In this case, as viewed from above, the first contact layer 32 shown by dotted lines is provided so as not to overlap the second contact layer 56.

Figure 3A:
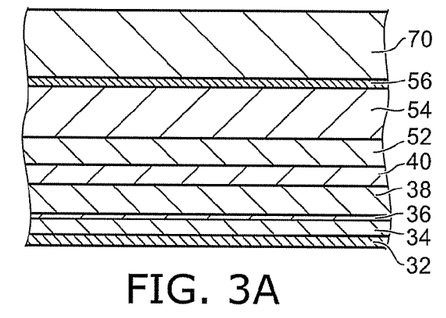
FIGS. 3A to 3F are cross-sectional views of manufacturing processes for the semiconductor light emitting device according to the first embodiment.
Figure 3B:
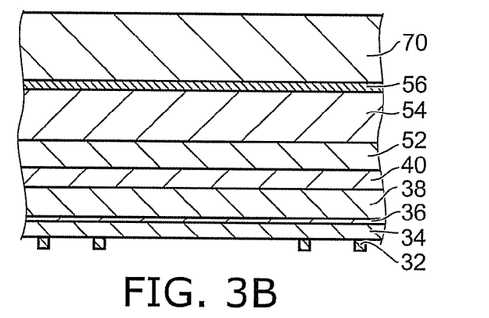
Figure 3C:
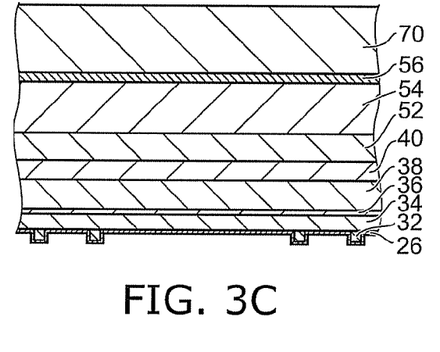
Figure 3D:
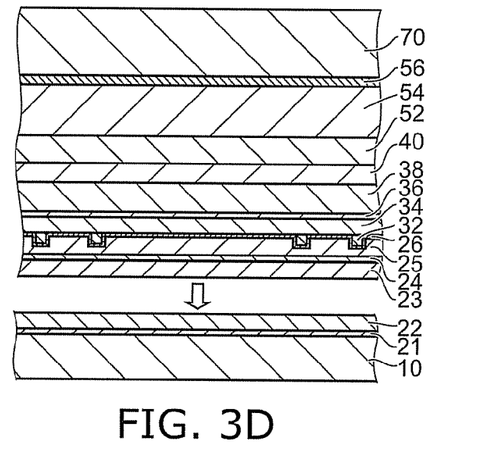
Figure 3E:
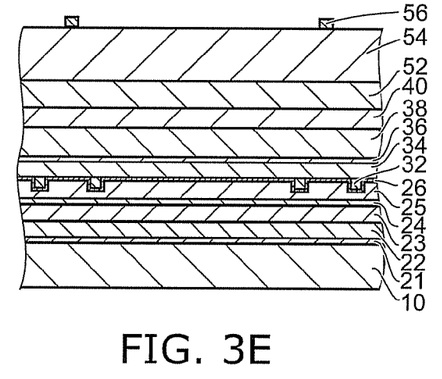
Figure 3F:
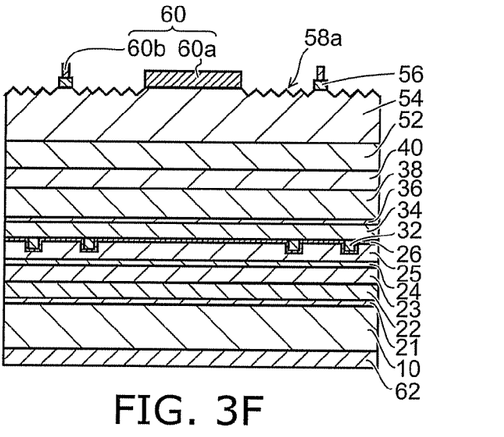

FIGS. 3A to 3F are cross-sectional views of a manufacturing processes for the semiconductor light emitting device according to the first embodiment, FIG. 3A is a schematic view of the semiconductor layer, FIG. 3B is a schematic view of the patterned first contact layer, FIG. 3C is a schematic view of ITO deposition, FIG. 3D is a schematic view of wafer bonding, FIG. 3E is a schematic view of the patterned second contact layer, and FIG. 3F is a schematic view of the completed and divided device.

The semiconductor layer 58 is formed by stacking the second contact layer 56 of n-type GaAs (carrier concentration of $1 \times 10^{18}$ cm$^{-3}$, thickness of 0.1 μm), the current spreading layer 54 of n-type $In_{0.5}(Ga_{0.3}Al_{0.7})_{0.5}P$ (carrier concentration of $1.6 \times 10^{18}$ cm$^{-3}$, thickness of 3.5 μm), the second cladding layer 52 of n-type $In_{0.5}Al_{0.5}P$ (carrier concentration of $4 \times 10^{17}$ cm$^{-3}$, thickness of 0.6 μm), the light emitting layer 40, the first cladding layer 38 of p-type $In_{0.5}Al_{0.5}P$ (carrier concentration of $3 \times 10^{17}$ cm$^{-3}$, thickness of 0.6 μm), the compositional graded layer 36 having a composition gradually changing from p-type $In_{0.5}(Ga_{0.3}Al_{0.7})_{0.5}P$ to p-type GaP (thickness of 0.03 μm), the window layer 34 of p-type GaP (impurity concentration of $3 \times 10^{18}$ cm$^{-3}$, thickness of 0.3 μm), the first contact layer 32 of p-type GaP (impurity concentration of $5 \times 10^{20}$ cm$^{-3}$, thickness of 0.1 μm) in this order on a growth substrate 70 made of GaAs (FIG. 3A).

The light emitting layer 40 is configured to be, for example, an MQW (Multi Quantum Well) structure having a well layer made of $In_{0.5}Ga_{0.5}P$ with a thickness of 4 nm, and a barrier layer made of $In_{0.5}(Ga_{0.4}Al_{0.6})_{0.5}P$ with a thickness of 7 nm. The light emitting layer 40 can emit light in a wavelength range of red light region from 0.61 to 0.7 μm. The structure of the semiconductor layer 58 is not limited thereto. The semiconductor layer 59 can be grown by crystal growth technique such as an MOCVD (Metal Organic Chemical Vapor Deposition) method, an MBE (Molecular Beam Epitaxy) method or the like.

Subsequently, as shown in FIG. 3B, a region of the first contact layer 32 for current injection into the window layer 34 is formed as a convex region by patterning and etching. A wet etching method using acid solution or a RIE (Reactive Ion Etching) method can be used for formation of the convex region of the first contact layer 32.

Subsequently, as shown in FIG. 3C, the transparent conductive film 26 such as tin doped indium oxide (ITO: Indium Tin Oxide), zinc oxide and tin oxide or the like is formed on all over the concave-convex surface of the semiconductor layer 58, including the patterned first contact layer (the convex region) and the window layer 34 serving as a bottom surface around the convex region.

Furthermore, the reflective metal layer 25 including at least one of Ag, Ag alloy, Au or the like, the barrier metal layer 24 including Ti, Pt, Ni or the like, the second bonding metal layer 23 including Au or AuIn or the like are formed in this order on the transparent conductive film 26. The barrier metal layer 21 including Ti, Pt, Ni or the like and the first bonding metal layer 22 of AuIn or the like are formed in this order on the substrate 10 made of conductive Si or the like. In this manner, adhesiveness between the first electrode 20 and the semiconductor layer 58 can be improved, and then the light extraction efficiency can be improved by the concave-convex structure.

As shown in FIG. 3D, a surface of the second bonding metal layer 23 on the side of the semiconductor layer 58 formed on the growth substrate 70 is in contact with the first bonding metal layer 22 on the side of the substrate 10 and the wafer bonding is performed by heating and pressurizing.

Subsequently, as shown in FIG. 3E, the growth substrate 70 is removed, and the second contact layer 56 is left only in the region for current injection of the narrow-line region 60b.

Subsequently, as shown in FIG. 3F, part of the narrow-line region 60b is formed on the region of the patterned second contact layer 56, and the pad region 60a is formed in the non-formation region of the second contact layer 56. The second electrode 60 including the pad region 60a and the narrow-line region 60b can be formed by stacking, for example, AuGe, Au or the like in this order from the side of the semiconductor layer 58. Furthermore, a frost etching process is performed on the surface of the semiconductor layer 58 without the second electrode 60 and the second contact layer 56 to form the concave-convex structures as the light extraction surface 58a. The back surface electrode 62 made of Ti/Pt/Au or the like is formed on the back surface of the substrate 10.

As the light emitting layer 40 includes $In_x(Ga_{1-y}Al_y)_{1-x}P$ ($0 \leq x \leq 1$, $0 \leq y \leq 0.6$), light in a wavelength range from green to red color can be emitted. As the light emitting layer 40 includes $Al_zGa_{1-z}As$ ($0 \leq z \leq 0.45$), light in a wavelength range from red to near-infrared light can be emitted. As the light emitting layer 40 includes $In_sGa_{1-s}As_tP_{1-t}$ ($0 \leq s \leq 1$, $0 \leq t \leq 1$), light in a wavelength range of near-infrared light can be emitted.

The first contact layer 32 and the window layer 34 are made of p-type GaP with a band gap energy larger than the band gap energy of the light emitting layer 40, and do not absorb light in a wavelength range longer than about 0.55 μm. The first contact layer 32 can be made of $In_{0.5}(Ga_{1-x}Al_x)_{0.5}P$ ($0.3 \leq x$) and $Al_xGa_{1-x}As$ ($0.5 \leq x$).

In the embodiment, the second contact layer 56 is based on GaAs, however the second contact layer 56 may be based on one of $In_x(Ga_{1-y}Al_y)_{1-x}P$ ($0 \leq x \leq 1$, $0 \leq y \leq 0.6$), $Al_zGa_{1-z}As$ ($0 \leq z \leq 0.5$) and $In_sGa_{1-s}As_tP_{1-t}$ ($0 \leq s \leq 1$, $0 \leq t \leq 1$). With regard to ohmic contact between semiconductor and metal, in general, semiconductor with a smaller band gap energy provides a lower contact resistance. Therefore, in a wavelength range of red to green emission light (band gap energy: 2.0 eV to 2.2 eV), the contact resistance can be decreased by using a material with the band gap energy smaller than the above (2.0 to 2.2 eV) for the second contact layer 56. For example, as sintering process is performed at 400° C. using GaAs (band gap energy is 1.4 eV) for the second contact layer 56 and an AuGe alloy for a material of the second electrode 60 being in contact with the second contact layer 56, the low contact resistance of $5\times10^{-5}$ $\Omega\cdot cm^2$ can be obtained.

A contact area (current injection area) between the narrow-line region 60b and the second contact layer 56 is small, therefore, in order not to increase the forward voltage in operation, the contact resistance is desired to be lower than $1\times10^{-4}$ $\Omega\cdot cm^2$. It is desirable that the material of the second contact layer 56 is based on one of $In_x(Ga_{1-y}Al_y)_{1-x}P$ ($0\leq x\leq1$, $0\leq y\leq0.6$), $Al_zGa_{1-z}As$ ($0\leq z\leq0.5$) and $In_sGa_{1-s}As_tP_{1-t}$ ($0\leq s\leq1$, $0\leq t\leq1$), having a band gap energy smaller than a band gap energy (2.0 to 2.2 eV) corresponding to a light emission wavelength range from red to green color.

The semiconductor layer 58 can be made of the light emitting layer 40 including $In_xGa_{1-x}N$ ($0\leq x\leq1$), and the window layer 34 and the first contact layer 32 including $Al_yGa_{1-y}N$ ($0\leq y\leq1$). In this case, the light emitting layer 40 can emit light in a wavelength range from ultraviolet to green color. The second contact layer 56 can include $In_xGa_{1-x}N$ ($0\leq x\leq1$).

ITO and GaP do not form an alloy layer, and thus the emitted light is not almost absorbed in the alloy layer. On the contrary, if the window layer made of GaP and the first contact layer made of GaP are in contact with Au without inserting ITO between GaP (the window layer and the first contact layer) and Au, the alloy layer is formed at the interface between GaP and Au by sintering process of the second electrode 60, and absorbs a part of the emitted light. As a result, brightness degrades.

High concentration carbon (C) is doped into the first contact layer 32 of p-type GaP. Experiments by the inventors have found out that as the impurity concentration of the first contact layer 32 is higher than $5\times10^{19}$ $cm^{-3}$, the contact resistance between the first contact layer 32 and ITO can be lower than $1\times10^{-3}$ $\Omega\cdot cm^2$. On the other hand, the impurity concentration of the window layer 34 made of p-type GaP (since the activation rate is considered to be approximately 1, the carrier concentration is approximately the same as the impurity concentration.) is in a range from $1\times10^{18}$ $cm^{-3}$ to $5\times10^{18}$ $cm^{-3}$. Zn, Mg and carbon can be used as the impurity in the window layer. It has been found out that if the impurity concentration of the GaP layer is lower than $5\times10^{19}$ $cm^{-3}$, the contact resistance between the first contact layer 32 and ITO is increased to be higher than $1\times10^{-3}$ $\Omega\cdot cm^2$, resulting in an increase of the forward voltage in operation As the reflective metal layer 25, Au can be also used. However, since the light reflectance of Au is decreased in the emission wavelength lower than 0.6 μm, use of Ag is suitable to achieve high brightness compared with Au. The light reflectance of Ag is not decreased remarkably even in a short wavelength region. Use of a Ag alloy in which small amount of In is added can improve moisture resistance and environmental resistance.

Figure 4:
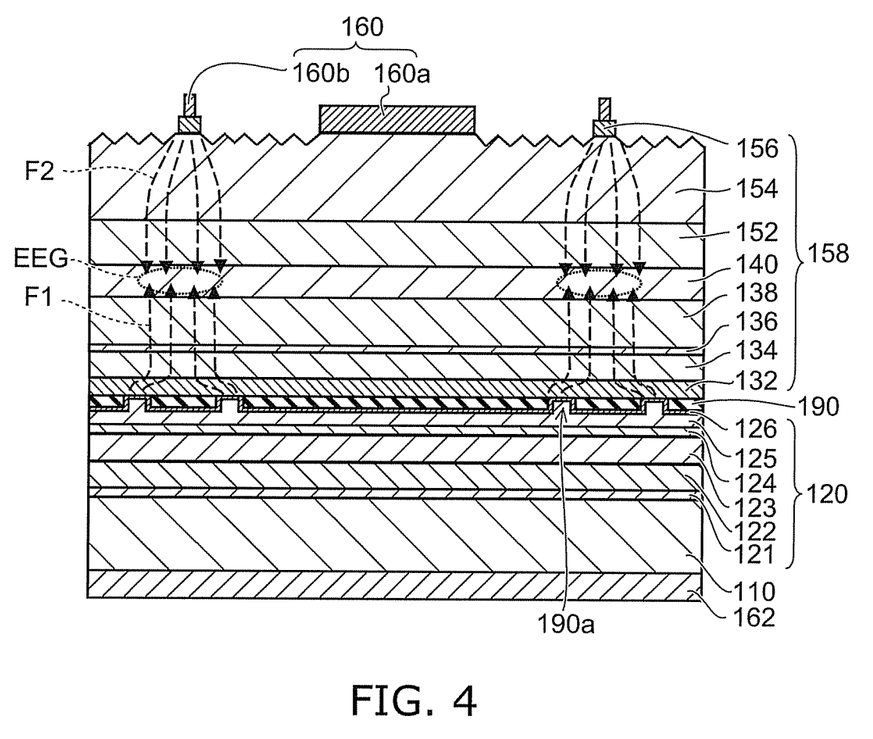
FIG. 4 is a schematic cross-sectional view of a semiconductor light emitting device according to a comparative example.

FIG. 4 is a schematic cross-sectional view of a semiconductor light emitting device according to a comparative example.

A first electrode 120 is provided on a substrate 110 made of Si. The first electrode 120 has a structure stacked with a barrier metal layer 121, a first bonding metal layer 122, a second bonding metal layer 123, a barrier metal layer 124, a Ag layer 125 and an ITO film 126 in this order from the substrate 110 side.

A semiconductor layer 158 includes a second contact layer 156, a current spreading layer 154, a second cladding layer 152, a light emitting layer 140, a first cladding layer 138, a compositional graded layer 136, a window layer 134 and a first contact layer 132 stacked in this order. Material, an impurity concentration, and a thickness of each layer are taken as the same as the first embodiment shown in FIG. 3A. An insulating layer 190 made of $SiO_2$ or the like is formed on the first contact layer 132 as a current blocking layer after crystal growth, and furthermore an opening 190a is provided selectively. The ITO film 126, the Ag layer 125, the barrier layer 124 and the second bonding metal layer 123 are provided so as to cover the opening 190a and the insulating layer 190. Thereafter, the structure in shown in FIG. 4 can be obtained after the wafer bonding process.

In the comparative example, holes injected from the first electrode 120 spread laterally in the first contact layer 132, since the first contact layer 132 is doped with a high concentration and its resistivity is extremely low. Electrons injected from a narrow-line region 160b of the second electrode 160 generates a carrier flow F2 spreading laterally and outward in the current spreading layer 154. That is, carriers spread above and below the light emitting layer 140. Therefore, a light emitting region EEG spreads laterally, the effective current injection density in the light emitting layer 140 is lowered and the emission efficiency is decreased.

On the contrary, in the first embodiment, since the contact resistance between the window layer 34, where the first contact layer 32 is removed, and the transparent conductive film 26 is high, holes are not injected in the window layer 34 directly from the transparent conductive film 26. Since the contact resistance between the first contact layer 32 and the transparent conductive film 26 is low, the carriers are injected to generate the carrier flow F1. In this case, holes are hard to spread laterally due to the selectively provided first contact layer 32, and lateral spread of a light emitting region ER can be suppressed. A total thickness of a p-type first conductivity type layer 30 including the first contact layer 32, the window layer 34 and the first cladding layer 38 is designed to be smaller than a total thickness of an n-type second conductivity type layer 50 including the second cladding layer 52, the current spreading layer 54 and the second contact layer 56, and an effective mass of hole is much larger than an effective mass of electron, therefore the holes flow directly into the light emitting layer 40 just above the first electrode 20.

On the other hand, the current spreading layer 54 has a low resistance and the effective mass of electron is small, therefore the electrons injected from the second electrode 60 spread laterally generating the carrier flow F2 and flowing into the light emitting layer 40 while spreading laterally. As a result, the light emitting region ER indicated by dotted lines does not spread just below the narrow-line region 60b. Therefore, the current injection density in the light emitting layer 40 is effectively increased, and high emission efficiency can be achieved. The inventors have confirmed that the brightness of the semiconductor light emitting device according to the first embodiment can be increased by 20% or more compared with the brightness of the semiconductor light emitting device of the comparative example. In this case, it has been also confirmed that forward voltage increase is suppressed and high reliability of the device can be achieved.

In the first embodiment, light Gd going downward from the light emitting layer 40 and passing through the first cladding layer 38, the compositional graded layer 36, the window layer 34 and the transparent conductive film 26 is reflected by the reflective metal layer 25, and reflected light Gr is going upward. The reflected light Gr and the light going upward from the light emitting layer 40 form output light Go and are emitted from the light extraction surface 58a. If the transparent conductive film 26 is too thick, the light Gd going downward interferes with the reflected light Gr going upward, and thus the brightness may be decreased. On the other hand, if the transparent conductive film 26 is too thin, the contact resistance between the first contact layer 32 and the transparent conductive film 26 increases, and thus the forward voltage may increase. According to experiments by the inventors, it has turned out that, as the thickness of the transparent conductive film 26 is set to be in a range from 0.04 to 0.09 µm, the forward voltage can be kept low with keeping the high brightness.

If the first contact layer 32 is too thin, the contact resistance between the transparent conductive film 26 and the first contact layer 32 increases and the forward voltage increases. Therefore, the thickness of the first contact layer 32 is necessary to be 0.03 µm or more in order to avoid increase of the forward voltage. On the other hand, since the impurity concentration in the first contact layer of GaP is high, an impurity level is formed in the band gap energy, and thus the light from the light emitting layer 40 may be absorbed. That is, when the thickness of the first contact layer 32 is more than 0.2 µm, the brightness decreases. Furthermore, if the first contact layer 32 is too thick, etching time of the first contact layer 32 becomes longer, and thus distribution of etching depth in the wafer plane may be degraded. Therefore, the thickness of the first contact layer 32 is preferred to be in a range from 0.03 to 0.2 µm.

If the window layer 34 is too thick, a current spreads laterally even in the window layer 34, the light emitting region ER spreads below the narrow-line region 60b, and resulting in decrease of the brightness. On the other hand, if the window layer 34 is too thin, control of etching depth becomes difficult. That is, in the case where the thickness of the first contact layer 32 is, for example, 0.1 µm, as etching is performed under a condition of 100% over-etching for removing the first contact layer to prevent current injection, the etching depth of 0.2 µm may be required. If the thickness of the window layer 34 is less than 0.2 µm, etching may proceed into the compositional graded layer 36 and/or the first cladding layer 38. Therefore, the thickness of the window layer 34 is preferred to be in a range from 0.2 to 0.6 µm.

Figure 5:
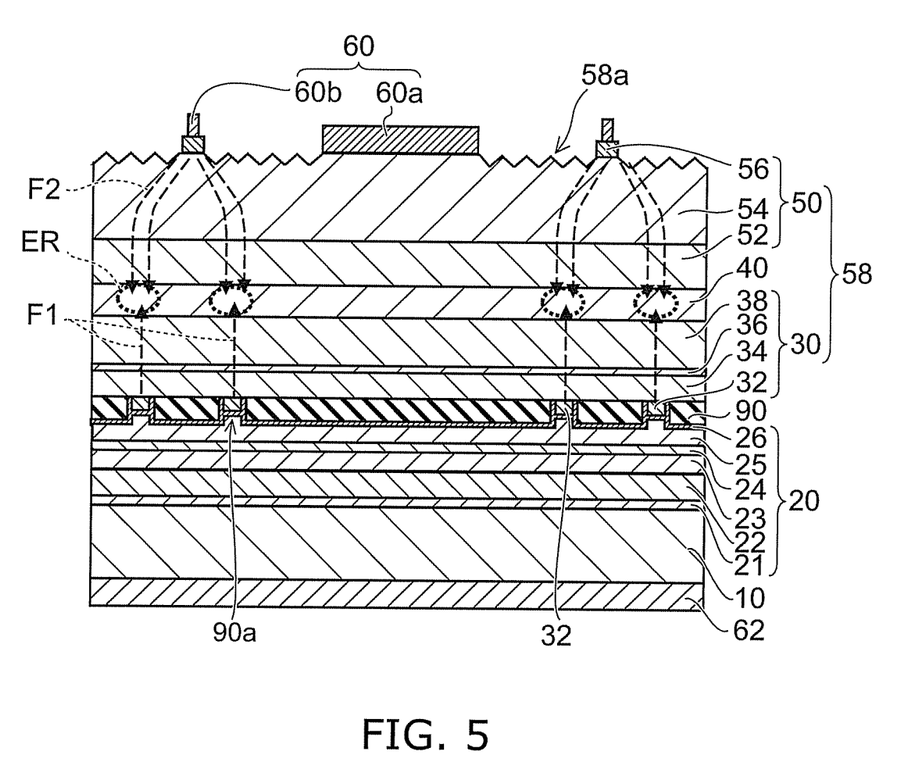
FIG. 5 is a schematic cross-sectional view of a semiconductor light emitting device according to a second embodiment.

FIG. 5 is a schematic cross-sectional view of a semiconductor light emitting device according to a second embodiment.

In the second embodiment, an insulating film 90 such as $SiO_2$ is provided on the surface of the window layer 34 where the first contact layer 32 is removed. An opening 90a is provided in the insulating film 90 to expose the first contact layer 32, and the transparent conductive film 26 is provided to cover the first contact layer 32 exposed at the opening 90a and the insulating film 90 (a non-formation region of the opening 90a). Moreover, the first electrode 20 is provided on the transparent conductive film 26. Holes are blocked by the insulating film 90, and thus are injected into the window layer 34 only through the first contact layer 32.

Also in the second embodiment, since the thickness of the first conductivity type layer 30 is smaller than the thickness of the second conductivity type layer 50, and an effective mass of hole is heavier than an effective mass of electron, holes are injected into the light emitting layer 40 just above the first contact layer 32 without spreading laterally in the first conductivity type layer 30. Therefore, as shown in FIG. 5, the light emitting region is located just above the first contact layer 32, and the current injection density can be kept high. The semiconductor light emitting device according to the second embodiment can increase the brightness by about 20% or more compared with the comparative example.

Use of $SiO_2$, SiON, and SiN ($Si_3N_4$ included) as the insulating film 90 can suppress the absorption of the light emitted from the light emitting layer 40, and can ensure the electrical insulation between the window layer 34 and the transparent conductive film 26. In the case of a high power LED having a high operation current density and operated by a high current higher than, for example, 1 ampere, the insulating film is preferred to be provided like this.

Figure 6A:
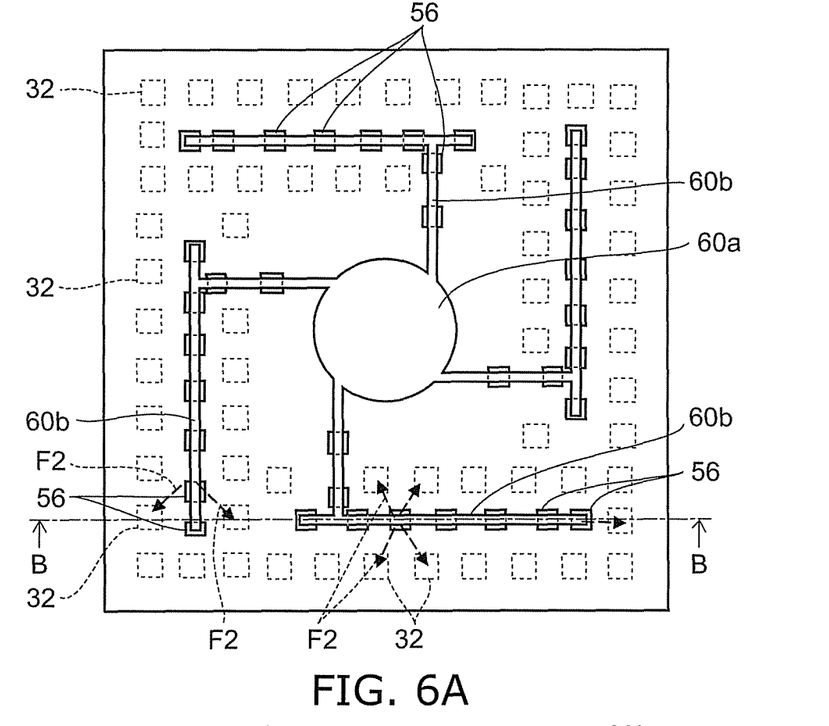
FIG. 6A is a schematic plan view of a semiconductor light emitting device according to a third embodiment.
Figure 6B:
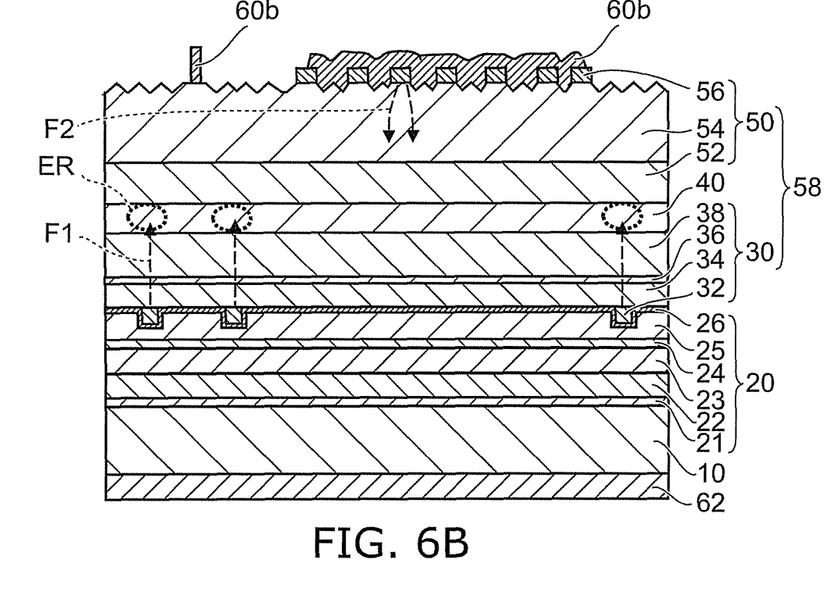
FIG. 6B is a schematic cross-sectional view taken along B-B line.

FIG. 6A is a schematic plan view of a semiconductor light emitting device according to a third embodiment, and FIG. 6B is a schematic cross-sectional view taken along B-B line.

A semiconductor layer 58 includes the second contact layer 56, the current spreading layer 54, the second cladding layer 52, the light emitting layer 40, the first cladding layer 38, the compositional graded layer 36, the window layer 34 and the first contact layer 32 stacked in this order. Material, an impurity concentration, and a thickness of each layer are taken as the same as the first embodiment shown in FIG. 3A.

The first contact layer 32 is dispersed along the narrow-line region 60b as viewed from above, as shown in FIG. 1A and FIG. 1B. The second contact layer 56 provided on the current spreading layer 54 and made of GaAs or the like is also dispersed underneath the narrow-line region 60b. The narrow-line region 60b extends on the dispersed second contact layer 56 and on the current spreading layer 54.

The contact resistance between the narrow-line region 60b and the second contact layer 56 is much lower than the contact resistance between the narrow-line region 60b and the current spreading layer 54 of n-type $In_{0.5}(Ga_{0.3}Al_{0.7})_{0.5}P$. Therefore, as shown in FIG. 6B, electrons are injected from the narrow-line region 60b into the second contact layer 56, and flow into the current spreading layer 54 through the second contact layer 56. The electrons are injected to the light emitting layer 40 with spreading laterally in the current spreading layer 54 and generating the carrier flow F2. On the other hand, the holes injected from the first contact layer 32 goes just above light emitting layer 40. In this case, a distance between the second contact layer 56 and the light emitting region ER above the first contact layer 32 becomes larger, and thus light absorption in the second contact layer 56 is reduced and the light extraction efficiency can be further improved. As only the second contact layer 56 is dispersed and the first contact layer 32 is provided continuously, the light absorption of the second contact layer 56 can be reduced.

In the semiconductor light emitting devices according to the first to third embodiments and a variation associated with these embodiments, the first contact layer 32 and the second contact layer 56 are provided so as not to overlap each other as viewed from above by removing at least one of the first contact layer 32 and the second contact layer 56 holding the light emitting layer 40 therebetween. The region with high light emission intensity in the light emitting layer 40 and the narrow-line region 60b are provided so as not to overlap each other. Therefore, the current injection density into the light emitting layer and the light emission efficiency can be increased and the light extraction efficiency can be increased. High power LEDs achieved in this manner are widely used for an illumination device, a display device and a traffic signal or the like.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
a substrate;
a first electrode provided on the substrate;
a first conductivity type layer provided on the first electrode, and including a first contact layer;
a light emitting layer provided on the first conductivity type layer;
a second conductivity type layer provided on the light emitting layer, and including a second contact layer; and
a second electrode provided on the second conductivity type layer, and including a narrow-line region and a pad region, part of the narrow-line region extending on the second contact layer, the pad region provided on a non-formation region of the second contact layer,
the first contact layer and the second contact layer being provided not to overlap each other as viewed from above, and
the first contact layer being dispersed along the narrow-line region of the second electrode extending on the second contact layer as viewed from above.

2. The device according to claim 1, wherein
the second contact layer is dispersed underneath the narrow-line region of the second electrode as viewed from above.

3. The device according to claim 1, further comprising an insulating film having an opening and provided between the window layer and the first electrode,
the first contact layer being provided in the opening.

4. The device according to claim 2, further comprising an insulating film having an opening and provided between the window layer and the first electrode,
the first contact layer being provided in the opening.

5. The device according to claim 1 wherein,
the first conductivity type layer further includes a window layer and a first cladding layer in this order from a side of the first contact layer,
the second conductivity type layer further includes a second cladding layer on a side of the light emitting layer and a current spreading layer on a side of the second contact layer, and
a thickness of the first conductivity type layer is smaller than a thickness of the second conductivity type layer.

6. A semiconductor light emitting device comprising:
a substrate;
a first electrode provided on the substrate;
a first conductivity type layer provided on the first electrode, and including a first contact layer,
a light emitting layer provided on the first conductivity type layer;
a second conductivity type layer provided on the light emitting layer, and including a second contact layer; and
a second electrode provided on the second conductivity type layer, and including a narrow-line region and a pad region, part of the narrow-line region extending on the second contact layer, the pad region provided on a non-formation region of the second contact layer,
the first contact layer and the second contact layer being provided not to overlap each other as viewed from above, and
the first electrode including a transparent conductive film and a reflective metal layer, the transparent conductive film being with the first contact layer and including one of tin doped indium oxide, zinc oxide and tin oxide, the reflective metal layer provided between the transparent conductive film and the support substrate and being able to reflect light from the light emitting layer.

7. A semiconductor light emitting device comprising:
a substrate;
a first electrode provided on the substrate;
a first conductivity type layer provided on the first electrode, and including a first contact layer,
a light emitting layer provided on the first conductivity type layer;
a second conductivity type layer provided on the light emitting layer, and including a second contact layer; and
a second electrode provided on the second conductivity type layer, and including a narrow-line region and a pad region, part of the narrow-line region extending on the second contact layer, the pad region provided on a non-formation region of the second contact layer,
the first contact layer and the second contact layer being provided not to overlap each other as viewed from above, and
a surface of the first conductivity type layer on a side of the first electrode including a convex region and a bottom region, the convex region being selectively provided and made of the first contact layer, and the bottom region being provided around the convex region and made of the window layer.

8. The device according to claim 1, wherein
a non-formation region of the second contact layer and the second electrode has concave-convex structures on a surface of the second conductivity type layer.

9. The device according to claim 1, wherein
the light emitting layer includes $In_xGa_{1-x}N$ ($0 \leq x \leq 1$), and the window layer and the first contact layer include $Al_yGa_{1-y}N$ ($0 \leq y \leq 1$), respectively.

10. The device according to claim 5, wherein
the first contact layer and the window layer includes GaP, and
the light emitting layer includes one of $In_x(Ga_{1-y},Al_y)_{1-x}P$ ($0 \leq x \leq 1$, $0 \leq y \leq 0.6$), $Al_zGa_{1-z}As$ ($0 \leq z \leq 0.5$) and $In_sGa_{1-s}As_tP_{1-t}$ ($0 \leq s \leq 1$, $0 \leq t \leq 1$).

11. The device according to claim 1, wherein a thickness of the first contact layer is between 0.03 μm and 0.2 μm.

12. The device according to claim 1, wherein
the second contact layer includes one of $In_x(Ga_{1-y},Al_y)_{1-x}P$ ($0 \leq x \leq 1$, $0 \leq y \leq 0.6$), $Al_zGa_{1-z}As$ ($0 \leq z \leq 0.5$) and $In_sGa_{1-s}As_tP_{1-t}$ ($0 \leq s \leq 1$, $0 \leq t \leq 1$).

13. The device according to claim 6, wherein
a thickness of the transparent conductive film is between 0.04 μm and 0.09 μm.

* * * * *